US010238002B2

(12) United States Patent
Lin (10) Patent No.: US 10,238,002 B2
(45) Date of Patent: Mar. 19, 2019

(54) PIVOT STRUCTURE AND ELECTRONIC DEVICE HAVING THE SAME

(71) Applicant: Che-Hsien Lin, Taipei (TW)

(72) Inventor: Che-Hsien Lin, Taipei (TW)

(73) Assignee: COMPAL ELECTRONICS, INC., Taipei (TW)

(*) Notice: Subject to any disclaimer, the term of this patent is extended or adjusted under 35 U.S.C. 154(b) by 124 days.

(21) Appl. No.: 15/407,260

(22) Filed: Jan. 17, 2017

(65) Prior Publication Data

US 2017/0208703 A1    Jul. 20, 2017

Related U.S. Application Data

(60) Provisional application No. 62/280,099, filed on Jan. 18, 2016.

(51) Int. Cl.
*E05D 3/18* (2006.01)
*H05K 7/16* (2006.01)
(Continued)

(52) U.S. Cl.
CPC ............... *H05K 7/16* (2013.01); *E05D 3/18* (2013.01); *E05D 5/02* (2013.01); *E05D 5/14* (2013.01);
(Continued)

(58) Field of Classification Search
CPC .... E05D 3/06; E05D 3/18; E05D 5/02; E05D 5/14; E05F 1/1016; E05F 1/1215;
(Continued)

(56) References Cited

U.S. PATENT DOCUMENTS 2,080,597 A * 5/1937 Bates ................. E05D 3/18
16/360
2,285,510 A * 6/1942 Gronberg ........... E05D 3/18
16/361
3,470,579 A * 10/1969 Cencioni ............ E05D 3/18
16/360
4,068,348 A * 1/1978 Chivers ............. E05D 3/12
16/235
(Continued)

FOREIGN PATENT DOCUMENTS

TW    M497412    3/2015
TW    M502317    6/2015
(Continued)

OTHER PUBLICATIONS

"Office Action of Taiwan Counterpart Application," dated Sep. 15, 2017, p. 1-p. 6.

*Primary Examiner* — Roberta S Delisle
(74) *Attorney, Agent, or Firm* — JCIPRNET (57) ABSTRACT

A pivot structure includes a base, a bracket, an elastic member and a positioning assembly. The bracket is rotatably connected to the base. The elastic member is disposed on the base. The positioning assembly includes a linkage member and a sleeve. The linkage member is pivoted to the bracket and has a positioning portion. The sleeve is pivoted to the base. The sleeve is fitted around the linkage member and has a releasing segment and a positioning segment. The bracket is adapted to be expanded to a first expanding state relative to the base by the elastic force of the elastic member, so as to drive the positioning portion to move along the releasing segment. The bracket is adapted to receive an external force to be continually expanded to a second expanding state relative to the base, so as to drive the positioning portion to move to the positioning segment.

20 Claims, 5 Drawing Sheets

(51) Int. Cl.
  *E05D 5/02* (2006.01)
  *E05D 5/14* (2006.01)
  *G06F 1/16* (2006.01)
  *E05F 1/10* (2006.01)
  *E05F 1/12* (2006.01)

(52) U.S. Cl.
  CPC .......... *E05F 1/1016* (2013.01); *G06F 1/1616* (2013.01); *G06F 1/1626* (2013.01); *G06F 1/1681* (2013.01); *E05D 2005/145* (2013.01); *E05F 1/1215* (2013.01); *E05Y 2900/606* (2013.01)

(58) Field of Classification Search
  CPC .... G06F 1/1616; G06F 1/1626; G06F 1/1681; H05K 7/16
  USPC .......................................... 16/357, 361, 366
  See application file for complete search history.

(56) References Cited

U.S. PATENT DOCUMENTS

| | | | | |
|---|---|---|---|---|
| 4,960,256 | A * | 10/1990 | Chihara | G06F 1/1616 16/361 |
| 5,050,270 | A * | 9/1991 | Burgei | E05D 1/04 16/298 |
| 5,479,678 | A * | 1/1996 | Reed | E05F 1/1223 16/303 |
| 7,596,831 | B2 * | 10/2009 | Faubert | E05D 3/18 16/287 |
| 8,201,304 | B2 * | 6/2012 | Steurer | E05F 1/1261 126/194 |
| 9,541,963 | B2 * | 1/2017 | Lin | G06F 1/1681 |
| 9,841,789 | B2 * | 12/2017 | Lin | G06F 1/1615 |

FOREIGN PATENT DOCUMENTS

TW    M524054    6/2016
TW    M543320    6/2017

* cited by examiner

PIVOT STRUCTURE AND ELECTRONIC DEVICE HAVING THE SAME

CROSS-REFERENCE TO RELATED APPLICATION

This application claims the priority benefits of U.S. provisional application Ser. No. 62/280,099, filed on Jan. 18, 2016. The entirety of the above-mentioned patent application is hereby incorporated by reference herein and made a part of this specification.

BACKGROUND OF THE INVENTION

Field of the Invention

The invention relates to a pivot structure and an electronic device having the same, and particularly relates to a pivot structure applied to a stand and an electronic device having the same.

Description of Related Art

Along with development of electronic industry, flat panel displays have gradually become a mainstream of the display. In the flat panel displays, a liquid crystal display (LCD) technique is the most mature and popularized, and is adapted to be applied to electronic devices such as notebook computers, tablet personal computers (PCs) and smart phones, etc.

In order to ensure a user to comfortably view images displayed by the electronic device, a stand can be set on a back surface of the electronic device. The stand can be expanded to support the electronic device on a desktop, such that a display surface of the electronic device may have a proper tilt angle to facilitate user's viewing. If a pivot torque between the stand and the electronic device is excessively large, the user is hard to expand the stand closed to the electronic device, such that usage of the stand is inconvenient. Conversely, if the pivot torque is excessively small, an expanding angle of the stand relative to the electronic device is hard to be fixed.

SUMMARY OF THE INVENTION

The invention is directed to a pivot structure and an electronic device having the same, by which usage convenience of a stand of the electronic device is improved, and an expanding angle of the stand is easy to be fixed.

The invention provides a pivot structure including a base, a bracket, an elastic member and a positioning assembly. The bracket is rotatably connected to the base. The elastic member is disposed on the base, and the bracket is adapted to contact the elastic member and resist an elastic force of the elastic member to be closed to the base. The positioning assembly includes a linkage member and a sleeve. The linkage member is pivoted to the bracket and has a positioning portion. The sleeve is pivoted to the base. The sleeve is fitted around the linkage member and has a releasing segment and a positioning segment. The bracket is adapted to be expanded to a first expanding state relative to the base through the elastic force of the elastic member, so as to drive the positioning portion to move along the releasing segment. The bracket is adapted to receive an external force to be continually expanded to a second expanding state relative to the base, so as to be separated from the elastic member and drive the positioning portion to move to the positioning segment.

The invention provides an electronic device including a body, a stand and a pivot structure. The pivot structure includes a base, a bracket, an elastic member and a positioning assembly. The base is connected to the body. The bracket is rotatably connected to the base, and the stand is connected to the bracket. The elastic member is disposed on the base, and the bracket is adapted to contact the elastic member and resist an elastic force of the elastic member to be closed to the base. The positioning assembly includes a linkage member and a sleeve. The linkage member is pivoted to the bracket and has a positioning portion. The sleeve is pivoted to the base. The sleeve is fitted around the linkage member and has a releasing segment and a positioning segment. The bracket is adapted to be expanded to a first expanding state relative to the base through the elastic force of the elastic member, so as to drive the positioning portion to move along the releasing segment. The bracket is adapted to receive an external force to be continually expanded to a second expanding state relative to the base, so as to be separated from the elastic member and drive the positioning portion to move to the positioning segment.

In an embodiment of the invention, an inner diameter of the releasing segment is greater than an inner diameter of the positioning segment.

In an embodiment of the invention, the base has at least one curved sliding slot, the bracket includes a bracket body and at least one sliding member, and the sliding member is connected to the bracket body and is slidably disposed in the curved sliding slot.

In an embodiment of the invention, the bracket is adapted to rotate relative to the base along a first rotation axis, the linkage member is pivoted to the bracket along a second rotation axis, the sleeve is pivoted to the base along a third rotation axis, and the first rotation axis, the second rotation axis and the third rotation axis are parallel to each other.

In an embodiment of the invention, the sleeve has an opening end and a pivot end opposite to each other, the pivot end is pivoted to the base, the linkage member is adapted to move back and forth relative to the sleeve through the opening end, and the positioning segment is located between the opening end and the releasing segment.

In an embodiment of the invention, the linkage member has a free end and a pivot end opposite to each other, the pivot end is pivoted to the bracket, and the positioning portion is located at the free end.

In an embodiment of the invention, a maximum outer diameter of the linkage member at the positioning portion is greater than an outer diameter of the other portion of the linkage member.

In an embodiment of the invention, a minimum outer diameter of the linkage member at the positioning portion is smaller than an outer diameter of the other portion of the linkage member.

In an embodiment of the invention, the linkage member has an open slot, and when the positioning portion is located at the positioning segment, the positioning portion is elastically deformed through the open slot to reduce the maximum outer diameter of the linkage member at the positioning portion.

In an embodiment of the invention, the sleeve has an open slot, and when the positioning portion is located at the positioning segment, the sleeve is elastically deformed through the open slot to increase an inner diameter of the sleeve.

According to the above description, in the pivot structure of the invention, the sleeve of the positioning assembly includes the releasing segment and the positioning segment. When the bracket is in a state between a closed state and the first expanding state, the positioning portion of the linkage member moves at the releasing segment of the sleeve and is not positioned by the positioning segment of the sleeve, such that the bracket and the stand connected to the bracket can be automatically expanded to the first expanding state through the elastic force of the elastic member. In this way, a situation that the user is hard to expand the stand closed to the body of the electronic device due to the positioning effect of the positioning assembly is avoided, so that usage convenience of the stand of the electronic device is improved. Moreover, when the bracket is continually expanded to the second expanding state from the first expanding state, the positioning portion of the linkage member is accordingly moved to the positioning segment of the sleeve, such that an expanding angle of the stand relative to the body is fixed as the positioning segment positions the positioning portion, so as to avoid the situation that the stand unexpectedly rotates relative to the body.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
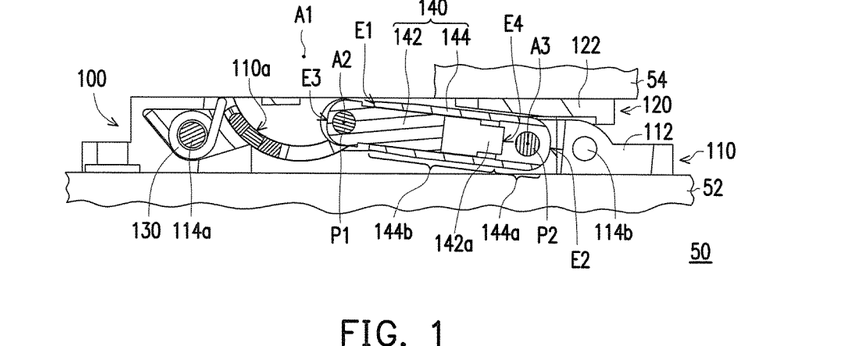
FIG. 1 is a partial cross-sectional view of an electronic device according to an embodiment of the invention.
Figure 2:
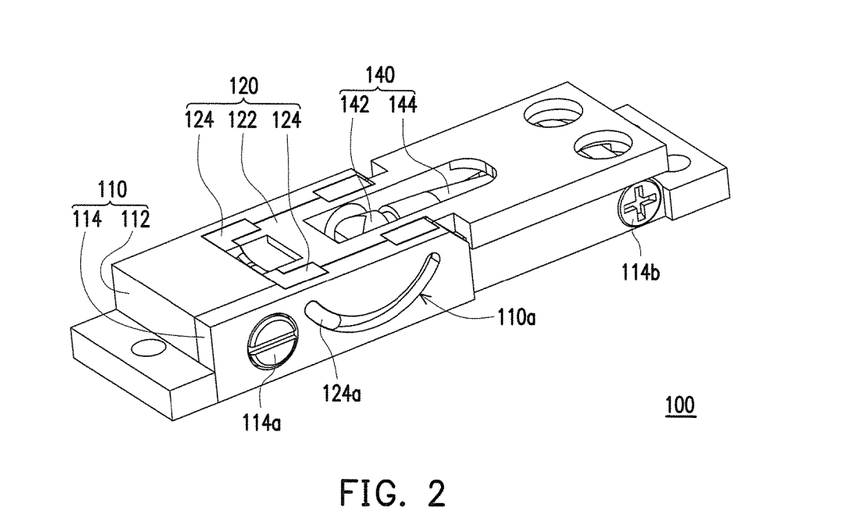
FIG. 2 is a three-dimensional view of a pivot structure of FIG. 1.
Figure 3:
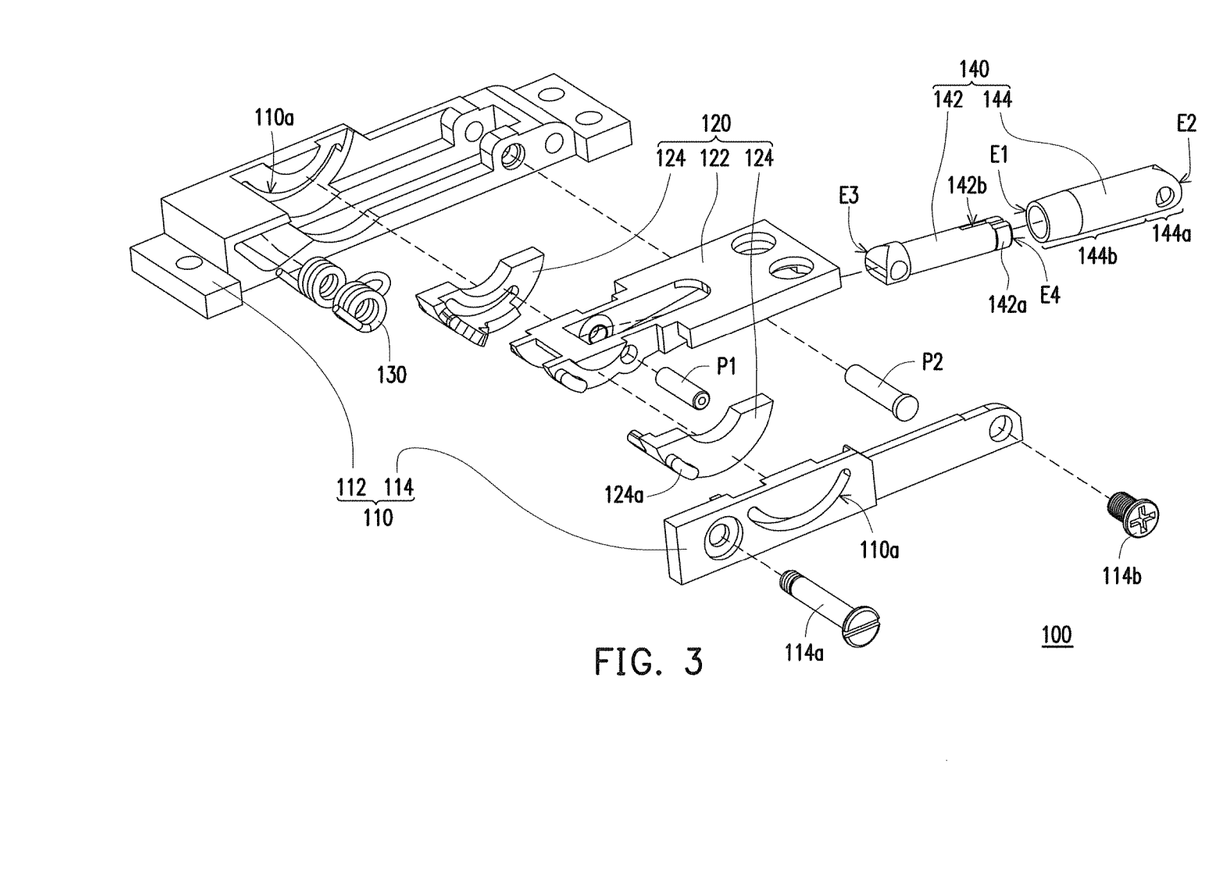
FIG. 3 is an exploded view of the pivot structure of FIG. 1.

FIG. 1 is a partial cross-sectional view of an electronic device according to an embodiment of the invention. FIG. 2 is a three-dimensional view of a pivot structure of FIG. 1. FIG. 3 is an exploded view of the pivot structure of FIG. 1. Referring to FIG. 1 to FIG. 3, the electronic device 50 of the present embodiment is, for example, a flat panel computer, a display of a notebook computer, a smart phone or other types of electronic device, and the electronic device 50 includes a body 52, a stand 54 and a pivot structure 100. The pivot structure 100 includes a base 110, a bracket 120, an elastic member 130 and a positioning assembly 140. The base 110 is connected to the body 52. The bracket 120 is rotatably connected to the base 110, and the stand 54 is connected to the bracket 120.

The elastic member 130 is, for example, a torsion spring and is disposed on the base 110, and the bracket 120 is adapted to contact the elastic member 130 as that shown in FIG. 1 and resist an elastic force of the elastic member 130 to be closed to the base 110. In the present embodiment, the stand 54 is, for example, limited to be closed to the body 52 through a magnetic force of a magnetic member or a buckle force of a buckle structure, such that the bracket 120 may resist the elastic force of the elastic member 130 for being closed to the base 110. The magnetic member and the buckle structure can be set on at least one of the body 52 and the stand 54, which is not limited by the invention. The positioning assembly 140 includes a linkage member 142 and a sleeve 144. The linkage member 142 is pivoted to the bracket 120 and has a positioning portion 142a. The sleeve 144 is pivoted to the base 110. The sleeve 144 is fitted around the linkage member 142 and has a releasing segment 144a and a positioning segment 144b.

Figure 4A:
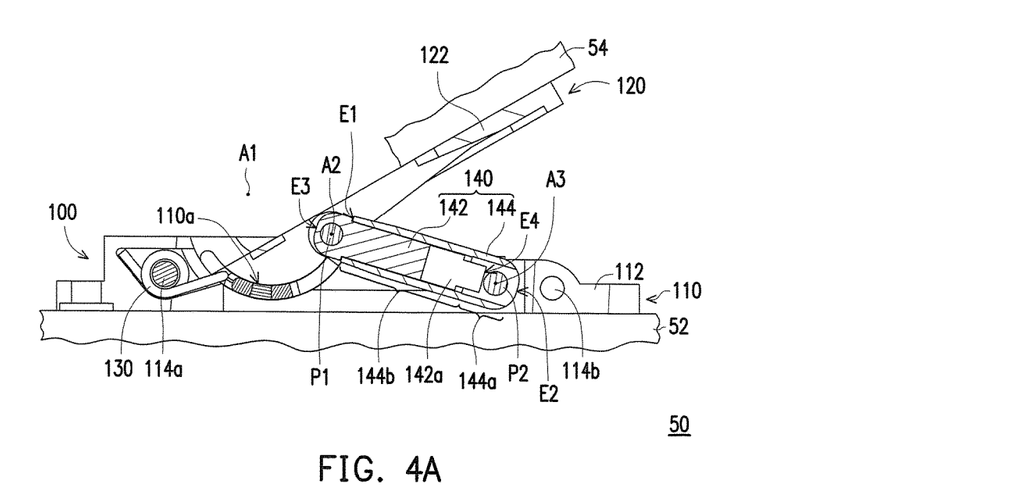
FIG. 4A and FIG. 4B are diagrams illustrating a situation that a bracket of FIG. 1 is expanded relative to a base.
Figure 4B:
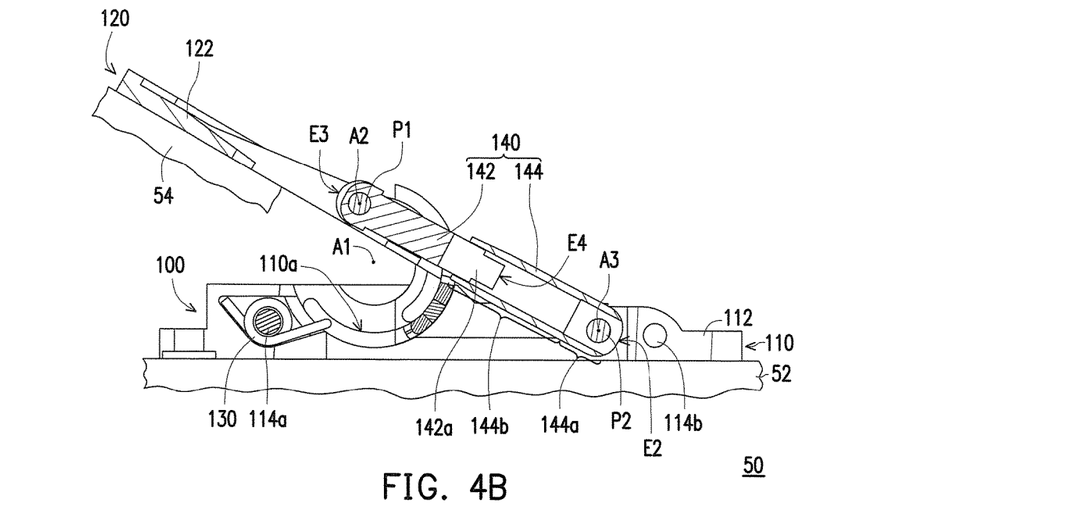

FIG. 4A and FIG. 4B are diagrams illustrating a situation that the bracket of FIG. 1 is expanded relative to the base. When a user exerts a force to the stand 54 to release the magnetic force or the buckle force between the stand 54 and the body 52, the bracket 120 is expanded to a first expanding state relative to the base 110 as that shown in FIG. 4A through the elastic force of the elastic member 130, and during such process, the bracket 120 drives the positioning portion 142a of the linkage member 142 to move along the releasing segment 144a of the sleeve 144. In the present embodiment, when the pivot structure 100 is in the state shown in FIG. 4A, an expanding angle of the bracket 120 relative to the base 110 is, for example, 30 degrees, though the invention is not limited thereto. Then, the user may continually exert the force to the stand 54, and the bracket 120 is continually expanded relative to the base 110 towards the angle shown in FIG. 4B to a second expanding state, such that the bracket 120 is separated from the elastic member 130, and the bracket 120 drives the positioning portion 142a of the linkage member 142 to move to the positioning segment 144b of the sleeve 144. In the present embodiment, when the pivot structure 100 is in the state shown in FIG. 4B, the expanding angle of the bracket 120 relative to the base 110 is, for example, 150 degrees, though the invention is not limited thereto. It should be noted that besides the expanding angle shown in FIG. 4B can be regarded as the second expanding state, the states between the expanding angle of FIG. 4A and the expanding angle of FIG. 4B can all be regarded as the second expanding state, and the expanding angle corresponding to the second expanding state is not limited by the invention.

According to the aforementioned configuration and operation method, when the bracket 120 is in a state between the closed state shown in FIG. 1 and the first expanding state shown in FIG. 4A, the positioning portion 142a of the linkage member 142 moves at the releasing segment 144a of the sleeve 144 and is not positioned by the positioning segment 144b of the sleeve 144, such that the bracket 120 and the stand 54 connected to the bracket 120 can be automatically expanded to the first expanding state through the elastic force of the elastic member 130. In this way, a situation that the user is hard to expand the stand 54 closed to the body 52 of the electronic device 50 due to the positioning effect of the positioning assembly 140 is avoided, so that usage convenience of the stand 54 of the electronic device 50 is improved. Moreover, when the bracket 120 is continually expanded to the second expanding state from the first expanding state shown in FIG. 4A, the positioning portion 142a of the linkage member 142 is accordingly moved to the positioning segment 144b of the sleeve 144, such that the expanding angle of the stand 54 relative to the body 52 is fixed as the positioning segment 144b positions the positioning portion 142a, so as to avoid the situation that the stand 54 unexpectedly rotates relative to the body 52.

Figure 5:
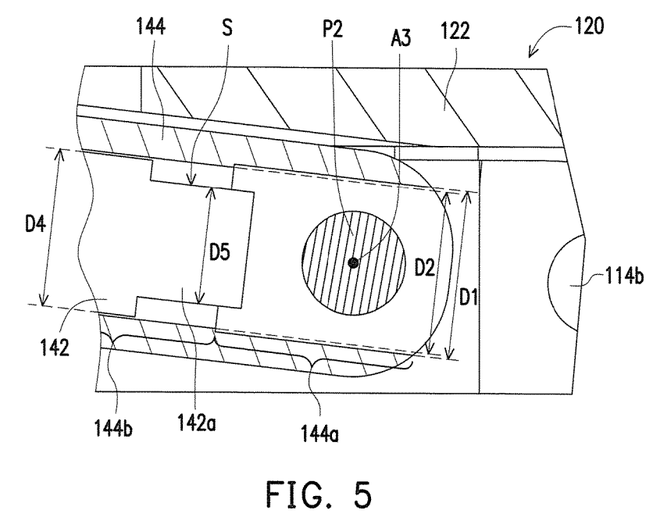
FIG. 5 is a partial enlarged view of the pivot structure of FIG. 1.
Figure 6:
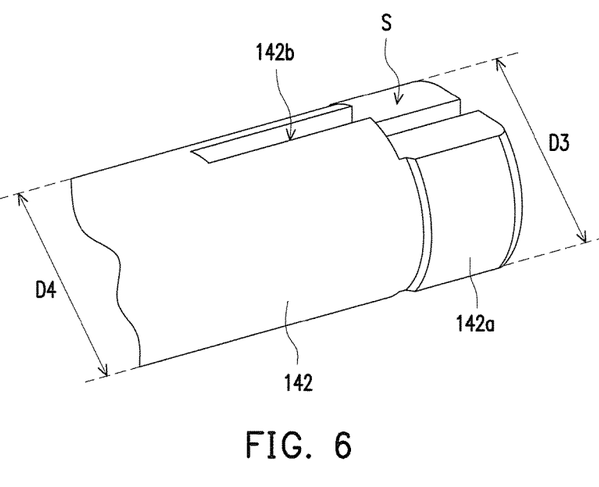
FIG. 6 is a partial enlarged view of a linkage member of FIG. 3.

FIG. 5 is a partial enlarged view of the pivot structure of FIG. 1. FIG. 6 is a partial enlarged view of the linkage member of FIG. 3. As shown in FIG. 5 and FIG. 6, a maximum outer diameter D3 of the linkage member 142 at the positioning portion 142a is greater than an outer diameter D4 of the other portion of the linkage member 142, such that the linkage member 142 may contact the positioning segment 144b through the positioning portion 142a with the larger outer diameter D3 to implement positioning. Moreover, as shown in FIG. 5, an inner diameter D1 of the releasing segment 144a is greater than an inner diameter D2 of the positioning segment 144b, such that the positioning portion 142a of the linkage member 142 may closely contact the sleeve 144 at the positioning segment 144b for positioning, and can be released at the releasing segment 144a. Moreover, the linkage member 142 has an open slot 142b, where the open slot 142b extends to the positioning portion 142a, and the positioning portion 142a may be elastically deformed through the open slot 142b to reduce the maximum outer diameter of the linkage member 142 at the positioning portion 142a, such that the positioning portion 142a can be smoothly moved to the positioning segment 144b from the releasing segment 144a, and the positioning portion 142a can be positioned at any place of the positioning segment 144b through an elastic force generated by the elastic deformation. Moreover, a partial area (i.e. a plane S shown in FIG. 5 and FIG. 6) of the linkage member 142 at the positioning portion 142a is flattened, such that a minimum outer diameter D5 of the linkage member 142 at the positioning portion 142a is smaller than the outer diameter D4 of the other portion of the linkage member 142, so as to avoid a situation that the positioning portion 142a cannot smoothly move along the sleeve 144 due to excessive interference between the positioning portion 142a and the sleeve 144.

Detailed structure of the pivot structure 100 of the present embodiment is described below. Referring to FIG. 1 to FIG. 3, the base 110 of the present embodiment includes main body 112 and an assembly portion 114, where the assembly portion 114 is assembled to the main body 112 through a lock member 114a and a lock member 114b, and the elastic member 130 is, for example, sleeved on the lock member 114a, and at least a part of the bracket 120 and at least a part of the positioning assembly 140 are located between the main body 112 and the assembly portion 114. Moreover, in the present embodiment, the sleeve 144 has an opening end E1 and a pivot end E2 opposite to each other, where the pivot end E2 is pivoted to the base 110, and the linkage member 142 is adapted to move back and forth relative to the sleeve 144 through the opening end E1, and the positioning segment 144b is located between the opening end E1 and the releasing segment 144a. Moreover, the linkage member 142 has a pivot end E3 and a free end E4 opposite to each other, where the pivot end E3 is pivoted to the bracket 120, and the positioning portion 142a is located at the free end E4.

Referring to FIG. 1 to FIG. 3, in detail, the base 110 of the present embodiment has two curved sliding slots 110a. The bracket 120 includes a bracket body 122 and two sliding members 124, and each of the sliding members 124 is connected to the bracket body 122 and has a sliding block 124a, and the sliding member 124 is slidably disposed in the corresponding curved sliding slot 110a through the sliding block 124a. Therefore, the bracket 120 may rotate relative to the base 110 along a first rotation axis A1 along with sliding of each of the sliding blocks 124a along the corresponding curved sliding slot 110a, where the first rotation axis A1, for example, passes through a center of curvature of each of the curved sliding slots 110a. Moreover, through a pivot pin P1, the linkage member 142 is pivoted to the bracket 120 along a second rotation axis A2 passing through the pivot pin P1, such that the linkage member 142 may rotate relative to the bracket 120 along the second rotation axis A2. The sleeve 144 is pivoted to the base 110 along a third rotation axis A3 through a pivot pin P2, such that the sleeve 144 may rotate relative to the base 110 along the third rotation axis A3. In the present embodiment, the first rotation axis A1, the second rotation axis A2 and the third rotation axis A3 are parallel to each other.

Figure 7:
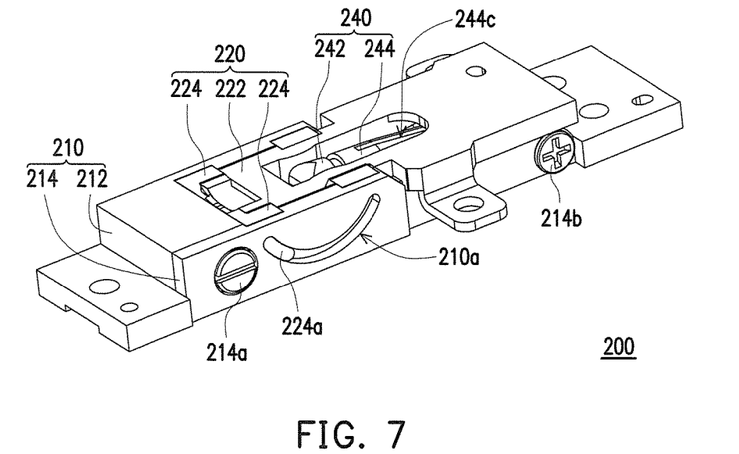
FIG. 7 is a three-dimensional view of a pivot structure according to another embodiment of the invention.
Figure 8:
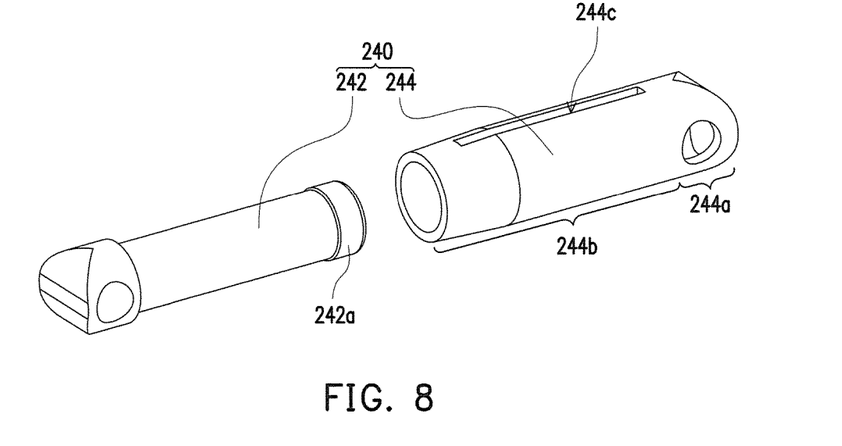
FIG. 8 is an exploded view of a positioning assembly of FIG. 7.

FIG. 7 is a three-dimensional view of a pivot structure according to another embodiment of the invention. FIG. 8 is an exploded view of a positioning assembly of FIG. 7. In the embodiment of FIG. 7 and FIG. 8, configuration and operation methods of a base 210, a curved sliding slot 210a, a main body 212, an assembly portion 214, a lock member 214a, a lock member 214b, a bracket 220, a bracket body 222, sliding members 224, sliding blocks 224a, a positioning assembly 240, a linkage member 242, a positioning portion 242a, a sleeve 244, a releasing segment 244a, and a positioning segment 244b are similar to that of the base 110, the curved sliding slot 110a, the main body 112, the assembly portion 114, the lock member 114a, the lock member 114b, the bracket 120, the bracket body 122, the sliding members 124, the sliding blocks 124a, the positioning assembly 140, the linkage member 142, the positioning portion 142a, the sleeve 144, the releasing segment 144a, and the positioning segment 144b of FIG. 1 to FIG. 6, and details thereof are not repeated.

A difference between the pivot structure 200 and the pivot structure 100 is that the linkage member 242 does not have the open slot 142b as that of the linkage member 142 (shown in FIG. 6). Instead, the sleeve 244 has an open slot 244c. When the positioning portion 242a is located at the positioning segment 244b of the sleeve 244, the sleeve 244 may be elastically deformed through the open slot 244c to increase an inner diameter of the sleeve 244. Therefore, the positioning portion 242a can be smoothly moved to the positioning segment 244b from the releasing segment 244a, and the positioning portion 242a can be positioned at any place of the positioning segment 244b through an elastic force generated by the elastic deformation.

In summary, in the pivot structure of the invention, the sleeve of the positioning assembly includes the releasing segment and the positioning segment. When the bracket is in a state between a closed state and the first expanding state, the positioning portion of the linkage member moves at the releasing segment of the sleeve and is not positioned by the positioning segment of the sleeve, such that the bracket and the stand connected to the bracket can be automatically expanded to the first expanding state through the elastic force of the elastic member. In this way, a situation that the user is hard to expand the stand closed to the body of the electronic device due to the positioning effect of the positioning assembly is avoided, so that usage convenience of the stand of the electronic device is improved. Moreover, when the bracket is continually expanded to the second expanding state from the first expanding state, the positioning portion of the linkage member is accordingly moved to the positioning segment of the sleeve, such that an expanding angle of the stand relative to the body is fixed as the positioning segment positions the positioning portion, so as to avoid the situation that the stand unexpectedly rotates relative to the body.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pivot structure, comprising:
a base;
a bracket, rotatably connected to the base;
an elastic member, disposed on the base, wherein the bracket is adapted to contact the elastic member and resist an elastic force of the elastic member to be closed to the base; and
a positioning assembly, comprising a linkage member and a sleeve, wherein the linkage member is pivoted to the bracket and has a positioning portion, the sleeve is pivoted to the base, and the sleeve is fitted around the linkage member and has a releasing segment and a positioning segment,
wherein the bracket is adapted to be expanded to a first expanding state relative to the base through the elastic force of the elastic member, so as to drive the positioning portion to move along the releasing segment, and the bracket is adapted to receive an external force to be continually expanded to a second expanding state relative to the base, so as to be separated from the elastic member and drive the positioning portion to move to the positioning segment.

2. The pivot structure as claimed in claim 1, wherein an inner diameter of the releasing segment is greater than an inner diameter of the positioning segment.

3. The pivot structure as claimed in claim 1, wherein the base has at least one curved sliding slot, the bracket comprises a bracket body and at least one sliding member, and the sliding member is connected to the bracket body and is slidably disposed in the curved sliding slot.

4. The pivot structure as claimed in claim 1, wherein the bracket is adapted to rotate relative to the base along a first rotation axis, the linkage member is pivoted to the bracket along a second rotation axis, the sleeve is pivoted to the base along a third rotation axis, and the first rotation axis, the second rotation axis and the third rotation axis are parallel to each other.

5. The pivot structure as claimed in claim 1, wherein the sleeve has an opening end and a pivot end opposite to each other, the pivot end is pivoted to the base, the linkage member is adapted to move back and forth relative to the sleeve through the opening end, and the positioning segment is located between the opening end and the releasing segment.

6. The pivot structure as claimed in claim 1, wherein the linkage member has a free end and a pivot end opposite to each other, the pivot end is pivoted to the bracket, and the positioning portion is located at the free end.

7. The pivot structure as claimed in claim 1, wherein a maximum outer diameter of the linkage member at the positioning portion is greater than an outer diameter of the other portion of the linkage member.

8. The pivot structure as claimed in claim 1, wherein a minimum outer diameter of the linkage member at the positioning portion is smaller than an outer diameter of the other portion of the linkage member.

9. The pivot structure as claimed in claim 1, wherein the linkage member has an open slot, and when the positioning portion is located at the positioning segment, the positioning portion is elastically deformed through the open slot to reduce the maximum outer diameter of the linkage member at the positioning portion.

10. The pivot structure as claimed in claim 1, wherein the sleeve has an open slot, and when the positioning portion is located at the positioning segment, the sleeve is elastically deformed through the open slot to increase an inner diameter of the sleeve.

11. An electronic device, comprising:
a body and a stand; and
a pivot structure, comprising:
a base, connected to the body;
a bracket, rotatably connected to the base, wherein the stand is connected to the bracket;
an elastic member, disposed on the base, wherein the bracket is adapted to contact the elastic member and resist an elastic force of the elastic member to be closed to the base; and
a positioning assembly, comprising a linkage member and a sleeve, wherein the linkage member is pivoted to the bracket and has a positioning portion, the sleeve is pivoted to the base, and the sleeve is fitted around the linkage member and has a releasing segment and a positioning segment,
wherein the bracket is adapted to be expanded to a first expanding state relative to the base through the elastic force of the elastic member, so as to drive the positioning portion to move along the releasing segment, and the bracket is adapted to receive an external force to be continually expanded to a second expanding state relative to the base, so as to be separated from the elastic member and drive the positioning portion to move to the positioning segment.

12. The electronic device as claimed in claim 11, wherein an inner diameter of the releasing segment is greater than an inner diameter of the positioning segment.

13. The electronic device as claimed in claim 11, wherein the base has at least one curved sliding slot, the bracket comprises a bracket body and at least one sliding member, and the sliding member is connected to the bracket body and is slidably disposed in the curved sliding slot.

14. The electronic device as claimed in claim 11, wherein the bracket is adapted to rotate relative to the base along a first rotation axis, the linkage member is pivoted to the bracket along a second rotation axis, the sleeve is pivoted to the base along a third rotation axis, and the first rotation axis, the second rotation axis and the third rotation axis are parallel to each other.

15. The electronic device as claimed in claim 11, wherein the sleeve has an opening end and a pivot end opposite to each other, the pivot end is pivoted to the base, the linkage member is adapted to move back and forth relative to the sleeve through the opening end, and the positioning segment is located between the opening end and the releasing segment.

16. The electronic device as claimed in claim 11, wherein the linkage member has a free end and a pivot end opposite to each other, the pivot end is pivoted to the bracket, and the positioning portion is located at the free end.

17. The electronic device as claimed in claim 11, wherein a maximum outer diameter of the linkage member at the positioning portion is greater than an outer diameter of the other portion of the linkage member.

18. The electronic device as claimed in claim 11, wherein a minimum outer diameter of the linkage member at the positioning portion is smaller than an outer diameter of the other portion of the linkage member.

19. The electronic device as claimed in claim 11, wherein the linkage member has an open slot, and when the positioning portion is located at the positioning segment, the positioning portion is elastically deformed through the open slot to reduce a maximum outer diameter of the linkage member at the positioning portion.

20. The electronic device as claimed in claim 11, wherein the sleeve has an open slot, and when the positioning portion is located at the positioning segment, the sleeve is elastically deformed through the open slot to increase an inner diameter of the sleeve.

* * * * *